United States Patent [19]

Nishiwaki et al.

[11] Patent Number: 4,576,797
[45] Date of Patent: Mar. 18, 1986

[54] VAPOR SOURCE HOLDING CONTAINER

[75] Inventors: Akira Nishiwaki; Yasuo Morohoshi; Hitoshi Mitake, all of Hachioji; Hiroyuki Moriguchi, Kofu; Hiroyuki Nomori, Hachioji; Kunio Ito, Tama, all of Japan

[73] Assignee: Konishiroku Photo Industry Co., Ltd., Japan

[21] Appl. No.: 527,667

[22] Filed: Aug. 30, 1983

[30] Foreign Application Priority Data

Sep. 4, 1982 [JP] Japan ................................. 57-154236

[51] Int. Cl.⁴ ............................................. C03B 25/14
[52] U.S. Cl. .................................... 422/102; 422/247; 156/DIG. 83; 219/271
[58] Field of Search ................ 118/726; 204/247, 274, 204/278; 219/271, 427, 426, 275; 156/DIG. 83, DIG. 103; 422/247, 102, 240

[56] References Cited

U.S. PATENT DOCUMENTS

| 3,281,517 | 10/1966 | Hemmer et al. | 219/275 |
| 3,373,260 | 3/1968 | Hilliard | 118/726 |
| 4,197,814 | 4/1980 | Takage | 118/726 |
| 4,217,855 | 8/1980 | Takage | 118/726 |
| 4,426,237 | 1/1984 | Freeouf et al. | 148/175 |
| 4,446,357 | 5/1984 | Barshter | 118/726 |
| 4,447,276 | 5/1984 | Davies et al. | 156/606 |

OTHER PUBLICATIONS

Chemical Rubber Co., Handbook of Chemistry and Physics, 46th Ed. 1965.

Primary Examiner—Hiram H. Bernstein
Attorney, Agent, or Firm—Finnegan, Henderson, Farabow, Garrett & Dunner

[57] ABSTRACT

A vapor source-holding container has an opening smaller than the evaporating area of the material held in the container and a wall portion in contact with the material and having an emissivity lower than the external surface of the wall portion not in contact with the material.

15 Claims, 10 Drawing Figures

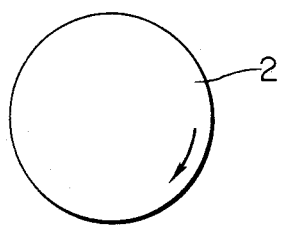
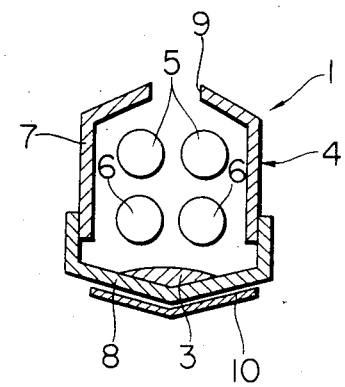
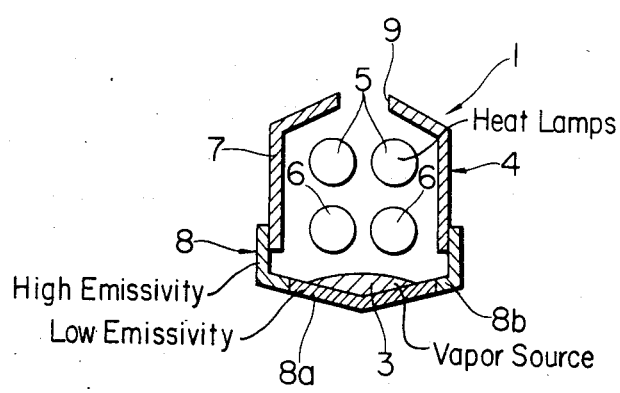
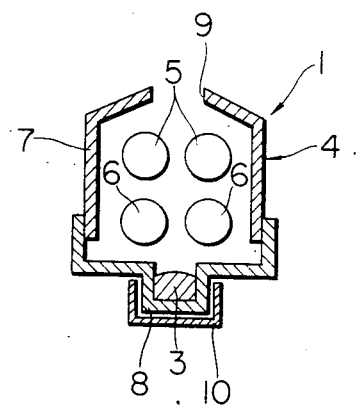
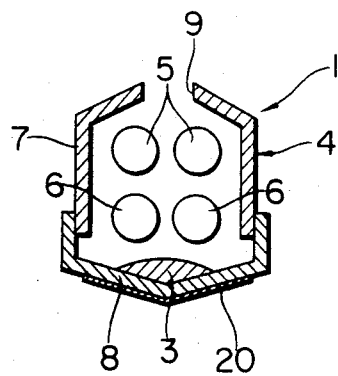

VAPOR SOURCE HOLDING CONTAINER

BACKGROUND OF THE INVENTION

1. Field of the Invention

The present invention relates to a vapor source holding container for the evaporation by heating of an evaporative material such as, for example, a material composed of selenium and tellurium. The container is constructed so that the vapor can be led out through an opening smaller in size than the evaporating area.

2. Description of the Related Art

Vapor source holding containers are called evaporating boats. Those that have a top opening of almost the same size as the evaporating area of a vapor source and are called open boats. However, it is difficult to control the evaporating rate in an open boat. In use this can cause abrupt boiling of the vapor source. This problem exists even if an open boat were composed of a low emissivity material.

On the other hand, the so-called Knudsen cell type container is free from this drawback. Such containers are excellent because the top opening is smaller than the evaporating area. Therefore, the evaporating rate is effectively controllable. If vapor bursts by an abrupt boiling, before arriving at the top opening, it attaches to the wall portion, so that the vapor never flies out toward the vacuum deposition-receiving substrate.

However, it has now been found that when the heat emissivity of the external surface of the boat, particularly of the external surface of the wall portion that is in contact with the vapor source is great, the variation in the temperature distribution increases in the longitudinal direction of the vapor source due to the heat radiation from aforesaid surface and also in the vertical direction of the vapor source. Such variations of the temperature distribution produce unevenness in the evaporation, thus leading to unevenness in the thickness and characteristics of the resulting deposition layer. This results in lowering the yield of the product.

When the heat emissivity of the external surface of the boat is low, the amount of heat released from the wall portions is low. Therefore, immediately after the heating begins, the temperature rises so quickly that it easily exceeds the settled evaporating temperature. If the heater is then turned off, the temperature then becomes lower. If this is followed by continued temperature controls, the temperature hovers around the evaporating temperature. This is called the hunting phenomenon. The large variation of temperature distribution causes unevenness in the thickness and characteristics of the deposition layer. Therefore, the yield rate of the products is lowered. Further, the temperature response temperature control becomes worse because it is hard for the heat to be emitted from the boats. Therefore, it requires many hours to reach and stably obtain the given evaporating temperature. Furthermore, the boat's cooling rate after completion of the evaporation is as low. This significantly lowers the efficiency of the evaporating operation in addition to providing the difficulty in the temperature control mentioned above.

Phenomenalistic investigations of a vapor source in a fused state have shown that a density convection is caused in the fused solution or a convection generated by the difference of the surface tension in the surface region of the fused solution causes the composition of vapor to become unstable. This is especially true when the vapor source is composed of an alloy, so that the density distribution of a deposited layer is dispersed.

Therefore, it is desirable to be in a state where the described phenomena can be prevented, and namely where a deposition is to be made under such a condition that the Rayleigh number and the Marangoni number of an alloy-fused solution are not greater than 1700 and 100, and more preferably not greater than 100 and 50, respectively, provided that the above numbers are defined as the following formulas:

$$\text{Rayleigh No., Ra} = \frac{g \cdot \beta \cdot l^3 \cdot \Delta Tl}{\nu \cdot \kappa}$$

$$\text{Marangoni No., Mn} = \frac{\left(-\frac{d\gamma}{d\tau}\right) \cdot l \cdot \Delta Ts}{\mu \cdot \kappa}$$

wherein,
- g: acceleration of gravity
- $\beta$: thermal expansion coefficient
- l: depth of solution
- $\nu$: kinematic viscosity
- $\kappa$: thermal diffusibility
- $\gamma$: surface tension
- T: temperature
- $\mu$: viscosity
- $\Delta Tl$: temperature gradient per unit length in the direction of depth of solution
- $\Delta Ts$: temperature gradient between arbitrary two points of the surface of solution

OBJECTS AND SUMMARY OF THE INVENTION

The present invention has been made to solve the above-mentioned shortcomings of the evaporating boat, and it was accomplished by a vapor source holding container for the evaporation by heating an evaporative material, which is so constructed that the vapor of said material is led out through an opening smaller in size than the evaporating area of said material, wherein the emissivity of at least the external surface of the wall portion that is in contact with the material is smaller than that of at least the external surface of the other wall portion that is not in contact with the material.

BRIEF DESCRIPTION OF THE DRAWINGS

FIG. 1 shows the main portions of the vacuum evaporator of the present invention.

FIG. 2, FIG. 3 and FIG. 4 are the sectional views of other examples of the present invention.

FIG. 5 is a side view of the evaporating source of the vacuum evaporator shown in FIG. 1.

DETAILED DESCRIPTION

Figure 6A:
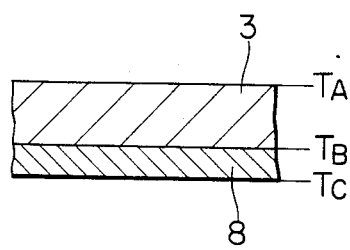
FIG. 6A is a partially enlarged sectional view similar to FIG. 6A, of an example of the present invention.

The vapor source holding container of the present invention, by a combination of the low emissivity wall portion in contact with the evaporative material and the high emissivity of other wall portions, produces a significant effect as is described below. Namely, the emissivity of the portion in contact with the evaporative material is minimized so that the amount of the heat released outward from that portion is largely reduced. It is preferable to make the emissivity not more than 0.4, and even more preferable to make the emissivity not more than 0.1. The container of the present invention allows reduced variation in the temperature distribution in the longitudinal and the vertical direction of the evaporating source. Stabilization of the evaporation prevents unevenness of the evaporation, of the thickness, and of the characteristics of the vacuum deposition layer, thus largely improving the yield thereof. The wall area not in contact with the evaporative material has a high emissivity (preferably not less than 0.7) and occupies a major of the container. Because of this, the heat released from the container can be increased in its entirety. It is preferable that the heat released is not less than 90% of the heating source's output). As a result, the temperature responsiveness is largely improved which allows for highly accurate temperature control. Therefore, the overheating phenomenon as previously mentioned will not occur, and it is possible to heat the container and retain a given temperature within a short time period. In addition, the cooling rate is increased and largely improves the efficiency of the evaporating operation.

In the present invention, the low emissivity portion may be composed of mirror-grinding-treated Al, brass, Cr., Cu, Au, Fe, Mo, Ni, Pt, Ta, W, or the like, while the high emissivity portion may be composed of thermally oxidized stainless steel, Alumite-treated Al, ceramics, or the like.

The above low-emissivity portion may be integrated with the other wall portions into one unit. Alternatively, the wall portion in contact with the evaporative material may have a low emissivity-having material thereoutside. In the case of the latter, the low emissivity-having material is mounted to the external surface of the wall portion which contacts the evaporative material the low emissivity material is coated over the same by flame spraying or vapor deposition.

Examples of the present invention are illustrated in detail below with reference to the drawings.

FIG. 1 is a schematic illustration showing the principal part of a vacuum evaporator which comprises a belljar (not shown) having thereinside a vapor source-holding container 1 and a substrate 2 to be deposited (such as, for example, a rotatable aluminum drum) facing opposite to the container. Container 1 comprises an evaporating boat 4 which holds a vapor source 3 such as, for example, selenium-tellurium alloy. Boat 4 is comprised of upper wall portions 7 holding therein a first pair of heater lamps 5 above a second pair of heater lamps 6. Lower wall portion 8 holds a vapor source 3, and the upper wall portion 7 has a top opening 9 whose size is smaller than the evaporating area of vapor source 3. The evaporated vapor flies outward toward the substrate through the opening in a controlled state; this is what is called "knudsen Cell" type container.

In this container, in accordance with the present invention, the vapor source contacting portion $8a$ of boat wall portion 8 has an emissivity ($\epsilon$) of not more than 0.4, and is preferably formed by a highly ground surface of not more than 0.1 having aluminum ($\epsilon = 0.01$). The other wall portions $8b$ and 7 are formed by a high emissivity (particularly $\epsilon \geqq 0.7$) and is composed, for example, of thermally oxidized stainless steel a ($\epsilon \div 0.9$). This low emissivity portion $8a$ is integrated into one continuous piece with the other wall portion $8b$ of the wall 8 by means such as welding. Wall 8 is integrated into one continuous piece with the other wall portion 7.

It is hard to release heat from the vapor source because low emissivity material $8a$ is present in the area in contact with the vapor source. At the same time the heat released from the entire boat can be increased due to high emissivity materials $8b$ and 7.

In the example of FIG. 2, boat body 4 itself is formed by, for example, a normally heat-treated stainless steel. However, the wall portion in contact with a vapor source 3 has on its external surface a cover material 10 made of a low emissivity material as described above. Mounting a cover material 10 in this way also can reduce the heat released by radiation from the external surface of the boat, and particularly from the portion of vapor source 3. However, the heat released from the entire boat is increased. In FIG. 3, a cover material 10 is provided similar to FIG. 2, but the figure shows a boat wherein the vapor source 3 holding portion takes a different form.

In FIG. 4, wall portions 7 and 8 in the similar form to those in FIG. 2 are provided on the external surface thereof with a low emissivity-having material 20 as described above. Material 20 is coated by flame spraying or vapor deposition on the surface.

In the examples in FIG. 2, through FIG. 4, the variation in the temperature distribution by the heat released from the boat is prevented by cover material 10 or by coat layer 20. In addition, the internal surface of the boat may contain those low emissivity-having materials.

By the combination of the low emissivity material and high emissivity material, the following remarkable effect can be obtained as seen from the side view of the arrangement of FIG. 1, shown in FIG. 5.

Firstly, by use of the low emissivity materials $8a$, 10 and 20, in FIG. 5 the difference between maximum temperature and the minimum temperature ($\Delta T$) at any of the points A, B, and C in the longitudinal direction of boat 1 becomes as small as a few degrees centigrade. Therefore, if a thermocouple is arranged as a temperature control system at one temperature measuring point (for example, middle point B) for a boat 4 of 3 m long, it is possible to carry out any desired temperature control. In the case where a light-sensitive layer is produced by vacuum deposition, any possible occurrence of unevenness of the sensitivity can be prevented by this arrangement to improve the characteristics of the light sensitive layer. In contrast, $\Delta T$ in conventional boats becomes as large as about 20° C. to 35° C., thus bringing about problems as the unevenness of the evaporation described above.

Figure 6B:
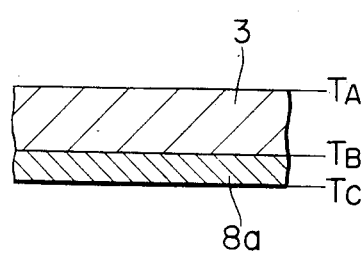
FIG. 6B is an enlarged sectional view, similar to FIG. 6A, of an example of the present invention.

FIGS. 6A and 6B show the temperature distribution in the vertical direction of the vapor source. If the liquid surface temperature of evaporative material (alloy-fused liquid) 3 is regarded as TA, the bottom temperature as TB, and the external surface temperature of wall portion 8 as TC, in the case of the conventional example in FIG. 6A (the emissivity thereof is as large as not less than 0.5), the variation in the temperature distribution becomes as large as TA (about 330° C.) >>TB (about 300° C.) >TC (about 295° C.). However, in the case of using low emissivity-having material 8a as the wall material 8 according to the present invention (FIG. 6B), the variation becomes as small as TA (302° C.) ÷TB (300° C.) ÷TC (299° C.), thus showing a uniform temperature distribution also in the vertical direction. It was found that a stable evaporation can be made when the temperature gradient of an alloy-fused solution is not larger than 10° C./cm in the direction of the depth thereof. In the conventional example, the difference TA-TB is large, and the evaporating temperature changes for as much as 30 degrees centegrade as from 330° C. to 300° C., so that an unevenness of the evaporation occurs. In the present invention TA-TB is as small as 2° C. so that a stable evaporation can be effected.

Figure 7:
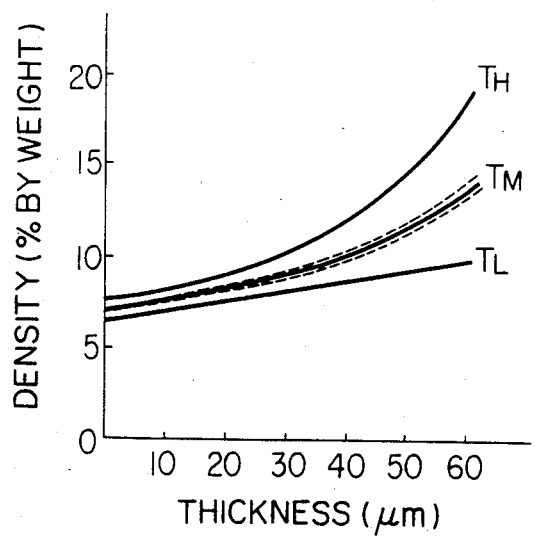
FIG. 7 is a graph showing the Te concentration profile in the obtained vacuum deposition layer in which the solid line represents the curve for the conventional example and the dotted line represents that for the present invention.

FIG. 7 shows a Te concentration profile of the Se-Te vacuum deposition layer obtained in the above-described manner. In carrying out this evaporation, a Se-Te alloy whose Te content is 13.5% by weight was used as the vapor source, and this was heated to 300° C. under a degree of vacuum inside the belljar of not more than $10^{-4}$ Torr.

A conventional device has variation in the temperature in the longitudinal direction of the evaporating source shown in FIG. 5. The Te concentration distribution in the direction of the thickness of the vacuum deposition layer as shown with solid lines in FIG. 7 was obtained from those portions of the maximum temperature (TH), the intermediate temperature (TM) and the minimum temperature (TL). As can be seen, Te concentration in the deposition layer is outstandingly uneven locally.

However, when wall portions of the boat, in accordance with the present invention, are formed by, covered with or coated with materials 8a, 10 and 20 having an emissivity of, e.g., 0.06 (see FIG. 1 through FIG. 4), the variation in the temperature distribution becomes very small as shown with broken lines in FIG. 7. As can be seen, the Te concentration of the deposition layer becomes very uniform as a whole, and the dispersion thereof falls under the range of ±1%. In addition, the temperature gradient of the surface of the alloy-fused solution was not larger than 20° C. between any two points.

Figure 8:
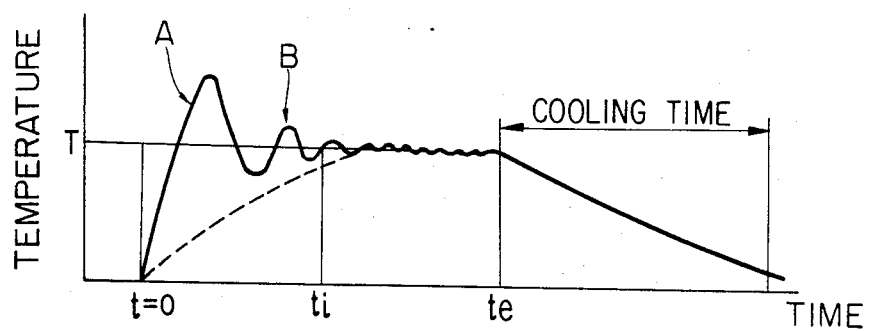
FIG. 8 is a time chart showing the change in temperature of the evaporating source according to the conventional example.

On the other hand, FIG. 8 shows the variation in the temperature when using the conventional low heat emissivity boat. Because the temperature quickly rises immediately after the commencement of heating, the overheating phenomenon A occurs. When the heater is then turned off, the temperature lowers to excess, which is then followed by the hunting phenomenon B. Accordingly, there are cases where the time (ti) spent waiting to obtain the set temperature T in a stable condition (e.g., an evaporating temperature of 300° C.) requires as long as 60 minutes. The solid line in FIG. 8 shows this. Further, if the other means for raising temperature is employed for the purpose of avoiding the hunting phenomenon, a period as long as 2 hours is required before the stable set temperature T is obtained. The dotted line in FIG. 8 shows this situation.

Figure 9:
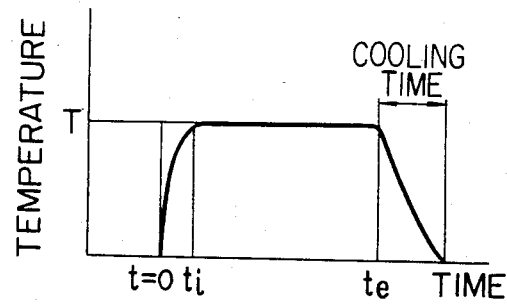
FIG. 9 is a time chart showing the change in temperature of the evaporating source according to the present invention.

Further, because the boat cannot be quickly cooled, it takes a considerable time from the time to commence cooling (te) until the temperature returns to the original temperature. In contrast, in the case of using the evaporating source according to the present invention, the overall heat released increases due to high emissivity materials 8b and 7. As shown in FIG. 9, time (ti) required to obtain the set temperature T becomes remarkably reduced (e.g., by 15 minutes), so that an evaporating period (te-ti) of about 40-70 minutes may be enough. Further, the post-te cooling time is also remarkably reduced. Accordingly, the evaporating source in accordance with the present invention is readily maintained at the set temperature by use of a thermocouple. This is very advantageous for the efficiency of the operation. Furthermore, it is readily possible to achieve a state of Ra≦1700 and Mn≦100 by the container of the present invention.

The present invention has been described above, and the above examples are allowed to be modified in accordance with the technical idea of the present invention.

For example, the configuration and structure of the evaporating boat may be so modified that the above-mentioned evaporative material is put in a separate container, and the container may be arranged in the space of the evaporating source. Even in this case, the external wall of the evaporating source may be formed by a high emissivity-having material in accordance with the present invention. As the evaporative material, not only Se-Te but also Se-S, Fe-Ni, AgBr-I, or the like may be used.

What is claimed is:

1. A vapor source holding container for the evaporation, by heating, of an evaporative material in said container, said container comprising:
   an opening smaller in size than the surface area of said evaporative material, a first wall portion at the bottom of said container which is in contact with said evaporative material, and
   a second wall portion, connected to said first wall portion and said opening, wherein said second wall portion is not in contact with said evaporative material, wherein the emissivity of at least the external surface of the first wall portion of said container in contact with the material is lower than the emissivity of at least the external surface of the second wall portion that is not in contact with the material.

2. A vapor source holding container according to claim 1 wherein the first wall portion laterally abuts the remaining wall portion and includes an interior surface having generally the same emissivity as the external surface of said first wall portion.

3. The vapor source holding container according to claim 1 wherein the first wall portion includes an interior surface portion having generally the same emissivity as the external surface of the second wall portion and wherein the external surface of the first wall portion is composed of a low emissivity material.

4. The vapor source holding container according to claim 3 wherein the external surface of the first wall portion includes low emissivity material which is attached to the outside of the internal surface portion.

5. The vapor source holding container according to claim 3 wherein the external surface of said first wall portion includes a coating of low emissivity material.

6. The vapor source holding container according to claim 1 wherein the emissivity of the first wall portion is not more than 0.4 and the emissivity of the second wall portion is not less than 0.7.

7. The vapor source holding container according to claim 3 wherein the first wall portion is composed of a material selected from mirror-grinding-treated Al, brass, Cr, Cu, Au, Fe, Mo, Ni, Pt, Ta and W.

8. A vapor source holding container for the evaporation by heating of an evaporative material in said container comprising:
   a first wall portion generally defining the area for contact with the evaporative material;
   a remaining wall portion connected to the first wall portion to form said container;
   an opening in the remaining wall portion for emitting the vapor of the evaporative material, the opening being smaller in area than the first wall portion;
   wherein the external surface of the first wall portion has a lower emissivity than the external surface of the remaining wall portion.

9. A vapor source holding container according to claim 8 wherein the first wall portion laterally abuts the remaining wall portion and includes an interior surface having generally the same emissivity as the external surface of the first wall portion.

10. The vapor source holding container according to claim 8 wherein the first wall portion includes an interior surface portion having generally the same emissivity as the external surface of the remaining wall portion and wherein the external surface of the first wall portion is composed of a low emissivity material.

11. The vapor source holding container according to claim 10 wherein the external surface of the first wall portion includes a piece of low emissivity material which is attached to the outside of the internal surface portion of the first wall portion.

12. The vapor source holding container according to claim 10 wherein the external surface of the first wall portion includes a coating of low emissivity material.

13. The vapor source holding container according to claim 8 wherein the emissivity of the first wall portion is not more than 0.4 and the emissivity of the remaining wall portion is not less than 0.7.

14. The vapor source holding container according to claim 10 wherein the first wall portion is composed of a material selected from the group consisting of mirror-grinding-treated Al, brass, Cr, Cu, Au, Fe, Mo, Ni Pt, Ta and W.

15. A vapor source holding container according to claim 8 including heating elements provided within the container.

* * * * *